United States Patent [19]

Hoffman et al.

[11] Patent Number: 4,749,362
[45] Date of Patent: Jun. 7, 1988

[54] SHORT-CIRCUIT-PROOF CONNECTOR CLIP FOR A MULTITERMINAL CIRCUIT

[75] Inventors: Eric J. Hoffman, Ellicott City; Jack C. Loessi, Columbia, both of Md.

[73] Assignee: The Johns Hopkins University, Baltimore, Md.

[21] Appl. No.: 483,858

[22] Filed: Apr. 11, 1983

Related U.S. Application Data

[63] Continuation-in-part of Ser. No. 209,876, Nov. 24, 1980, abandoned.

[51] Int. Cl.⁴ .......................................... H01R 11/24
[52] U.S. Cl. ................................ 439/269; 324/158 P; 439/620
[58] Field of Search ......... 339/108 TP, 147 R, 147 P, 339/255 P, 200 P; 324/133, 149, 158 F, 158 P, 72.5, 158 R; 439/269, 620

[56] References Cited

U.S. PATENT DOCUMENTS

| | | | |
|---|---|---|---|
| 3,506,949 | 4/1970 | Venaleck et al. | 339/174 |
| 3,996,511 | 12/1976 | Baer | 324/72.5 |
| 4,055,800 | 10/1977 | Fisk et al. | 324/158 F |
| 4,066,953 | 1/1978 | Gold | 324/149 |
| 4,132,946 | 1/1979 | Holdren et al. | 324/158 P |

FOREIGN PATENT DOCUMENTS 1521614  8/1978  United Kingdom ............ 324/158 F

Primary Examiner—Neil Abrams
Attorney, Agent, or Firm—Robert E. Archibald

[57] ABSTRACT

A connector clip, particularly useful in testing a dual in-line packaged (DIP) integrated circuit (IC), comprising a plurality of connector elements which are in contact with and serve to extend corresponding terminals of the IC, wherein at least one connector element includes a resistance which prevents damage to the IC or such other circuit in the event that connector elements are inadvertently short-circuited.

17 Claims, 1 Drawing Sheet

SHORT-CIRCUIT-PROOF CONNECTOR CLIP FOR A MULTITERMINAL CIRCUIT

STATEMENT OF GOVERNMENTAL INTEREST

The invention herein described was made in the course of or under a contract or subcontract thereunder with the Department of the Navy.

RELATED APPLICATION

This application is a Continuation-in-Part of Ser. No. 209,876, filed Nov. 24, 1980, now abandoned.

BACKGROUND OF THE INVENTION

The dual in-line package (DIP) integrated circuit (IC) is widely used in electrical and electronic applications, including applications where reliability is crucial. In space communications and instrumentation networks or systems, as well as medical applications, the requirement of continuing reliability can be particularly strict. For that reason, it is desirable and generally necessary to test the circuit boards containing DIP IC's before the boards are incorporated into such a network or system.

Such testing often includes the connecting of the pins, or terminals, of the DIP to test equipment so as to monitor appropriate outputs. Because of the small, compact nature of the DIP IC, it is possible for two terminals to be inadvertently short-circuited during the testing procedure and, possibly, during actual operation. Such short-circuiting can result in serious damage to the circuitry, damage which might not be detected until after the circuit board is connected into the network or system, and the entire network or system is put into operation. The cost of remedying the damage at that point can often be tremendous, if such damage can be repaired at all.

In order to test DIP IC's with greater facility, various devices have been suggested. U.S. Pat. No. 3,506,949 discloses a connector which engages a DIP IC so that each pin of the DIP component can be extended by a conductor which can be more easily connected to a probe or other piece of test equipment. U.S. Pat. No. 3,506,949 discloses a connector having a plurality of parallel conductors, each such conductor passing through a separate channel in the connector, thereby isolating the conductors from each other. While substantially eliminating the possibility of conductors touching along their lengths, the reference fails to address the problem of two conductors being short-circuited by a test probe or by an accidental bending of the conductor ends, which may also result in short-circuiting.

U.S. Pat. No. 3,899,239 similarly recognizes the serious damage that might be caused by the shorting of adjacent connector wires during testing. In response to this problem, the reference provides eyelets at the ends of connector elements onto which a test probe can be hooked. Further, adjacent connectors are disposed at 90° angles and each connector is insulated along its length except at the eyelet portions. Like U.S. Pat. No. 3,506,949, this reference addresses the problem of preventing short-circuiting but does not consider the problem of protecting the DIP circuitry when two connector wires are inadvertently short-circuited.

U.S. Pat. Nos. 3,914,007 and 3,551,878 also disclose clips, or connectors, which serve to extend the length of a DIP pin in order to facilitate testing. Neither of these references, however, confront the problem of preventing damage after there is a short across pin extenders. U.S. Pat. No. 3,551,878, in particular, does not suggest the inclusion of any elements which might protect the circuitry from the effects of short-circuiting and in fact suggests the opposite. According to this reference, it is recommended that the test connection be placed as close to the integrated circuit module as possible in order to "eliminate the electrical characteristics of the leads from the test system". The reference thus suggests that there be no elements along the connector leads which might affect the sensed output in any way.

The device disclosed in British Patent No. 1,521,614 relates to an integrated circuit chip test rack for use in automated testing where chip test points are automatically connected to a pair of conductive tracks at a terminal touch spot. Included is a diode which acts only as a switch, its state depending on the voltage applied thereto, which in turn determines if an associated input track or output track conducts. When the diode is forward biased, the input track conducts as a straight wire to provide an input testing signal on top of the biasing signal to the integrated circuit being tested. Conversely, a reverse biased diode appears as an open circuit which disconnects the input track and presents a high impedance to any output signal appearing on the associated output track. This diode does not operate to prevent a short circuit in the event adjacent integrated circuit (IC) terminals are simultaneously contacted by the automated test points. Specifically, with the diode forward biased, the corresponding signal of the input track is applied directly to all contacted IC terminals. Whereas, with the diode reverse biased, any contacted IC terminals would be connected directly to the associated output track. Thus, no short circuit protection is provided.

According to the British Patent, a substrate with its associated parts is provided at a testing station of an automatic testing apparatus; integrated circuit elements being fed in turn to the testing station at which each element is presented in a predetermined orientation. A test head carrying the substrate is advanced towards the element currently at the testing station. Thus, the only moving element is the integrated circuit having terminals which, if at all possible, may be electrically connected by misaligned terminal touch spots. Assuming arguendo that such a misalignment could occur, there is nothing in the British device that would prevent a short circuit between two chip terminals upon electrical connection with a terminal touch spot.

Fifty ohm resistances are included in the input/output tracks, providing matched termination to avoid the generation of unwanted reflections. In an automated testing mechanism such as the British device, a high frequency input signal (10 MHz) is used to test the IC terminals. Due to the high frequency of this signal, the input signal is electrically reflected from an associated terminal back through the input line, drastically distorting the desired test signal; i.e., the reflected signal sums with and subtracts from the original input signal. The fifty ohms provided in the input/output tracks is a value which only serves as a termination resistance to prevent reflections of the test signal and is insufficient to prevent a short circuit between any tracks which may, if at all possible, be electrically connected. In other words, to prevent damage to the IC chip, the current of the test signal must be kept below a value of approximately 10 milli-amps. Since the IC terminals are supplied with voltages of up to 10 v, a resistance of 100 ohms, (assuming two inputs are shorted together in the British device) will allow a current of 100 milli-amps to flow, thus destroying the IC.

SUMMARY OF THE INVENTION

To alleviate the problem of overstressed or damaged IC's associated with inadvertent short-circuiting of connector elements during the manual testing of DIP IC's, the present invention comprises a test clip having a plurality of connector elements each of which contacts a corresponding pin or terminal on a DIP IC, wherein at least one connector element includes a protecting resistance. The resistance may be integrally incorporated into the connector (or connectors) or, alternatively, may comprise a resistance element (or elements) interposed between two conductive leads. The value of the resistance is selected to be low enough that it will not appreciably affect the measurements made during testing but to be large enough to protect the various IC circuits from short-circuiting in the event that two connector elements are inadvertently bridged.

It is thus an object of the present invention to provide a DIP test clip which not only facilitates circuit testing at selected DIP IC pins and prevents the touching of two connector elements but also includes a resistance in at least one connector element which is sufficient in value to prevent damage to the DIP IC should a connector element be shorted to an adjacent connector element with a test probe or other conductor.

It is another object of the invention to provide a resistance along each connector element which is sufficient, when coupled to the resistance of another connector element, to prevent damage to that portion of the IC which is in electrical contact with the particular short-circuited connector elements.

It is yet another object of the invention to provide means whereby the resistance in each connector element can, optionally, have a distinct value depending on the IC which is being tested, the circuitry associated with the particular connector element, and the test being undertaken.

It is still yet another object of the invention to improve upon DIP IC test clip or connector modules of the types shown in U.S. Pat. Nos. 3,551,878, 3,899,239, and 4,116,518 and British Patent No. 1,521,614.

It is still yet a further significant object of the invention to prevent damage to circuitry that may result from the short-circuiting of connector elements in any connector module or interface, not just for a DIP IC, by placing an appropriate resistance on at least one of the connector elements. That is, where a module connects or interfaces one circuit, such as a microcircuit, to a test circuit or network with a plurality of connector elements, the present inventive concept of including low resistance elements along the connector elements to protect the microcircuit from damage in the event that two connector elements are shorted together is also contemplated. The present invention encompasses the inclusion of a resistance element in extender or connector elements whether or not in a DIP IC environment.

DESCRIPTION OF THE PRESENT INVENTION

Figure 1:
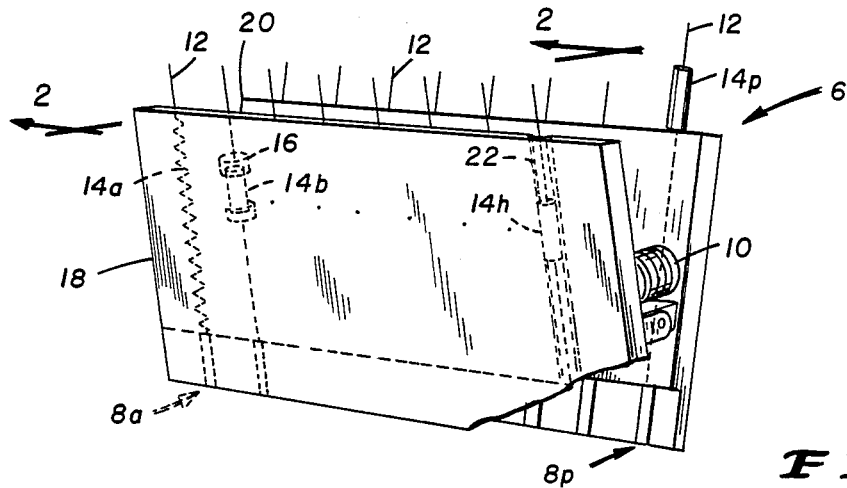
FIG. 1 is a perspective illustration of a connector clip made in accordance with the present invention which can accommodate a dual in-line package (DIP) integrated circuit (IC).
Figure 1:
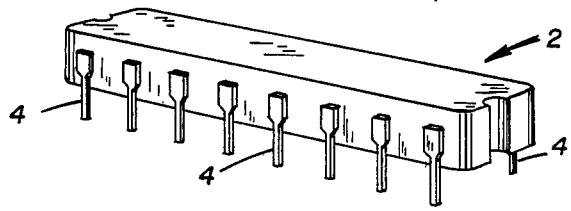

Referring to FIG. 1, a conventional dual in-line package (DIP) integrated circuit (IC) 2 is shown having a plurality of parallel pins or terminals 4 extending therefrom. As is conventional, the DIP terminals 4 can be soldered into a circuit board or fit into a socket (not shown) which has two lines of holes into which the terminals 4 fit. When the IC 2 is connected into a system, it is often difficult to attach or position a probe to test the internal circuitry of the IC 2 which is connected to the respective terminals 4.

To facilitate the testing procedure, connector clip 6 is structured to fit over the IC 2 and connect the DIP terminals 4 to connector elements 8a through 8p which are disposed along the connector clip 6. In order to tightly accommodate the IC 2 within the connector clip 6, spring means 10 can be provided. Extending from each connector element 8a through 8p is a connector lead 12 which can be engaged by a test probe or, where appropriate, to another circuit or network (not shown). In testing the IC 2, a technician may move a probe from one connector lead 12 to another and may temporarily attach the probe to one of the connector leads 12 during testing. To minimize the damage which could be caused by an inadvertent shorting of a plurality of the connector leads 12 (particularly if one connector lead 12 corresponds to an IC supply voltage terminal), resistance elements 14a through 14p are disposed along the connector elements 8a through 8p. Typically, the resistance placed along the connector elements 8a through 8p will comprise resistance having a total value of approximately 1000 ohms. For normal driving voltages of approximately 10 volts applied to the chip, 1000 ohms (500 ohms at each connector, for instance) will be low enough so as not to affect test measurements, but high enough to prevent damage to circuitry should two of the connector leads 12 be inadvertently short-circuited. Such a value of resistance (1000 ohms) would be adequate for most MOS circuitry which can be damaged by currents above 10 milli-amps. Approximately 10 milli-amps is generally considered to be the maximum safe operating current for lower power ICs. Thus the resistance value is selected as a function of the supply voltage $V_{cc}$ and a predetermined current level $I_{safe}$ at which the IC will operate without damage: the resistance value equalling $V_{cc}/I_{safe}$. As an example, where TTL circuitry is employed, a lower resistance may be utilized since this circuitry is normally driven at 5 volts.

In an alternate embodiment, the resistances of approximately 1000 ohms need only be utilized in those connector elements which correspond to voltage supply or ground terminals of the IC. Thus, as an example, protection would be provided by the 1000 ohms of the supply terminal connector element alone, should electrical contact occur between this connector element and a "straight wire" connector element.

With a manual probe, low frequency signals are used (d.c. to 100 KHz) which reflects negligibly and therefore does not necessitate a termination resistance. Thus, according to the invention, approximately 1000 ohms is used in the connector clip to prevent short circuits between connector IC terminals. However, 1000 ohms is too high to be utilized as a termination resistance. Thus termination resistances and protective resistances according to the invention not only differ in value by a large factor, but are used for entirely different purposes and neither of these resistances will function in the environment of the other.

The actual structure of the resistance may have various forms as suggested by FIG. 1. Resistance 14a is shown integrated into the entire length of connector element 8a. Alternatively, resistance element 14b is shown as an independent element held in place by sets of connector leads or holder means 16, into which an appropriate resistive element can be inserted at the discretion of the technician. Where different circuitry in the IC 2 would be better accommodated by one resistance rather than another, such selection is offered by use of the sets of holder means 16, arranged in parallel. In the preferred embodiment, however, all resistance elements 14a through 14p are of equal value. Resistances which form the elements 14a through 14p may be thick film resistors, chip resistors, carbon resistance wiring, or such other conventional resistance element as desired.

Figure 2:
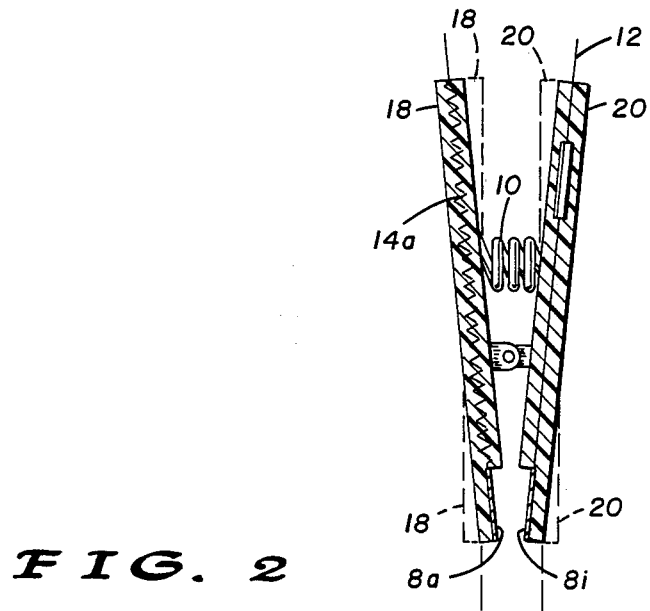
FIG. 2 is a side view of the connector clip and DIP IC taken along section line 2—2 of FIG. 1.

As seen in FIGS. 1 and 2, the resistance elements 14a through 14p, whether separate elements or integrated into the corresponding connector element, can be (a) imbedded into one of the insulative walls 18 or 20 of the connector clip 6 as shown by resistance element 14a, (b) may be permanently affixed as shown by resistance elements 14h to a lead 12 and disposed along a channel 22 cut into the wall 18, or (c) may be affixed by means of a modular holder means (see element 14b) attached to the wall 18 as dictated by the needs of the technician or user. Further, the resistance element can be similarly disposed along the "tail sections" of the connector leads 12. That is, the resistance element can be located not only in or along the wall of the connector clip or circuit module but can, alternatively, be placed at the edge of the wall as shown in FIG. 1 for connector element 14p. The resistance positioning as illustrated by element 14p *may require a retaining means (not shown) for fastening the resistance element 14p* between the wall 20 and the tail section or end of the associated connector lead 12. To protect the resistances from damage, it is preferred that they be contained by the walls 18 or 20 as with 14a, *14b*, and 14h.

Various modifications, adaptations and alterations to the present invention are of course possible in light of the above teachings, in addition to those embodiments set forth specifically. It should therefore be understood at this time that within the scope of the appended claims the invention may be practiced otherwise than as specifically described hereinabove.

What is claimed is:

1. An extension means to facilitate testing with a manually operated probe of an integrated circuit having a plurality of terminals, said integrated circuit sustaining likely damage if subjected to electrical current exceeding a predetermined level, said extension means comprising: a connector clip having a plurality of connectors each of which contacts a corresponding one of said terminals, at least one connector including a protective element having a resistive value sufficient to limit, upon electrical shorting of said at least one connector to another connector by said manually operated probe, current to corresponding terminals of said integrated circuit to below said predetermined level.

2. An extension means as in claim 1, wherein each connector comprises a protective element such that upon electrical shorting between said at least one connector and another connector, the sum of resistive values is sufficient to limit said current to said corresponding terminals to below said predetermined level.

3. An extension means as in claim 2, wherein each of the resistive values of said protecting elements are equal.

4. An extension means as in claim 3, wherein each protective element is a resistor.

5. An extension means as in claim 4, wherein each resistor is integrally connected to a corresponding connector.

6. An extension means as in claim 4, wherein said connector clip has an edge, and each of said connectors has an end at said connector clip edge to which said corresponding resistor is separately connected.

7. An extension means as in claim 4, wherein said connector clip has an insulative wall on which said connectors are disposed and on which said resistors are secured.

8. An extension means as in claim 4, also comprising sets of contact leads, each set extending from a corresponding one of said connectors, and an insulative wall along which the sets of contact leads are disposed in parallel, such that said resistors are connected to said connectors via said sets of contact leads.

9. An extension means as in claim 5, wherein each of said resistors has a value of approximately 500 ohms.

10. An extension means as in claim 6, wherein each of said resistors has a value of approximately 500 ohms.

11. An extension means as in claim 7, wherein each of said resistors has a value of approximately 500 ohms.

12. An extension means as in claim 8, wherein each of said resistors has a value of approximately 500 ohms.

13. An extension means as in claim 1, wherein said protective element comprises a resistance of approximately 1000 ohms.

14. An extension means as in claim 13, wherein said resistance is a resistor integrally connected to said at least one connector.

15. An extension means as in claim 13, wherein said connector clip has an edge, and said at least one connector has an end at said connector clip edge to which said resistor is connected.

16. An extension means as in claim 13, wherein said connector clip has an insulative wall on which the at least one connector is disposed and on which said resistor is secured.

17. An extension means as in claim 13, also comprising a set of contact leads extending from said at least one connector, and an insulative wall along which said set of contact leads are disposed such that said resistor is connected to said at least one connector via said set of contact leads.

* * * * *